United States Patent
Di Tommaso et al.

(10) Patent No.: US 6,546,361 B2
(45) Date of Patent: Apr. 8, 2003

(54) METHOD FOR RECORDING AND REMOVING THE BIPOLAR BIAS FROM A VIBRATION INPUT SIGNAL

(75) Inventors: Anthony M. Di Tommaso, Cranberry Township, PA (US); Ren-Chao Ye, Pittsburgh, PA (US)

(73) Assignee: ABB Automation Inc., Wickliffe, OH (US)

( * ) Notice: Subject to any disclaimer, the term of this patent is extended or adjusted under 35 U.S.C. 154(b) by 69 days.

(21) Appl. No.: 09/759,928

(22) Filed: Jan. 12, 2001

(65) Prior Publication Data

US 2002/0095272 A1 Jul. 18, 2002

(51) Int. Cl.$^7$ ................................................ H03M 1/06
(52) U.S. Cl. ........................ 702/189; 702/66; 702/193; 327/307
(58) Field of Search ............................ 702/66, 69, 70, 702/74, 75, 78, 79, 106, 107, 189, 193–195, 199; 73/645–648; 327/76, 307; 341/7, 8, 15

(56) References Cited

U.S. PATENT DOCUMENTS

| | | | | |
|---|---|---|---|---|
| 3,573,638 A | * | 4/1971 | Cox, Jr. et al. | ................ 327/74 |
| 3,894,288 A | * | 7/1975 | Musser, Jr. | ................... 327/76 |
| 4,097,860 A | * | 6/1978 | Araseki et al. | ............. 341/118 |
| 4,575,683 A | * | 3/1986 | Roberts et al. | ............. 329/311 |

\* cited by examiner

*Primary Examiner*—Marc S. Hoff
*Assistant Examiner*—Jeffrey R West
(74) *Attorney, Agent, or Firm*—Michael M. Rickin, Esq.

(57) ABSTRACT

A method for recording and removing the bipolar bias from a vibration input signal. The signal is a time varying signal where the bipolar bias has an amplitude which is many times greater than the amplitude of the time varying waveform of the signal that represents the vibration of the machine. In calculating the level of the bipolar bias the method approaches a predetermined dead band asymptotically and in stable manner. The determination of the bipolar bias level occurs when the next event has occurred and the time for that determination is much shorter than the time between occurrence of the events.

12 Claims, 6 Drawing Sheets

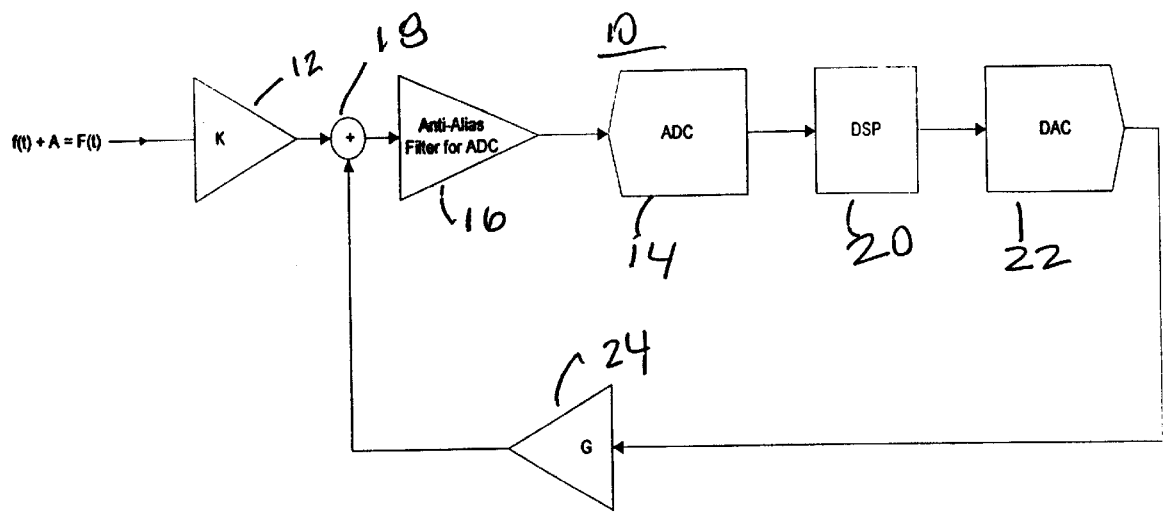
Figure 1 - Signal Flow Diagram for Bias Compensation Circuit

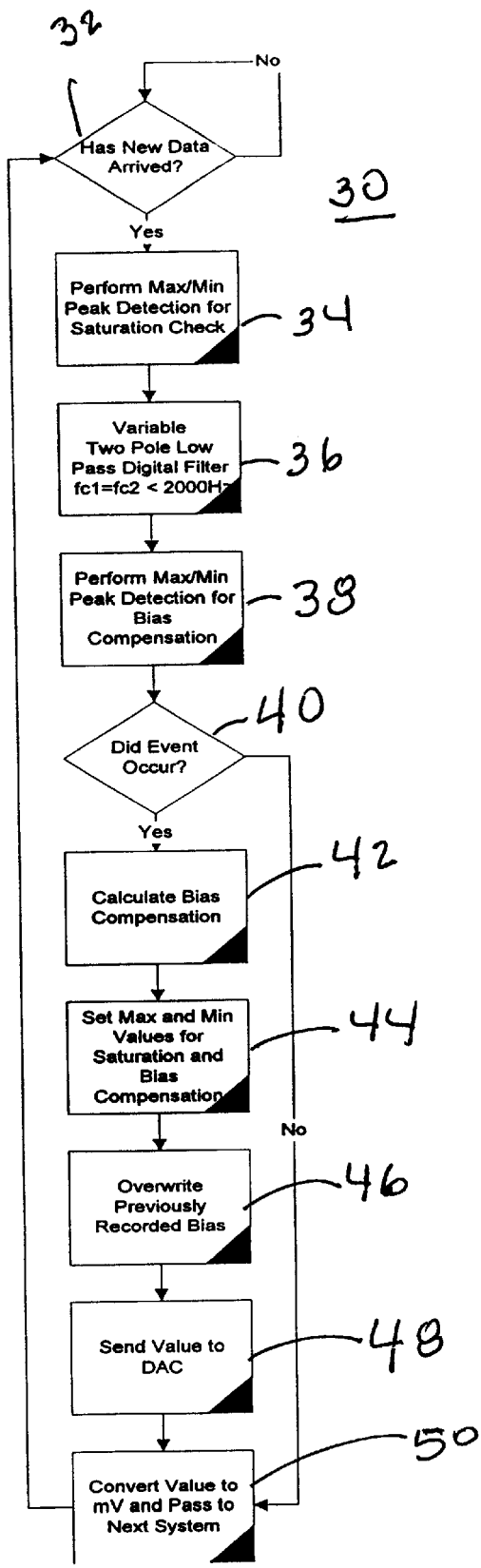
Figure 2 - Software Flow Diagram

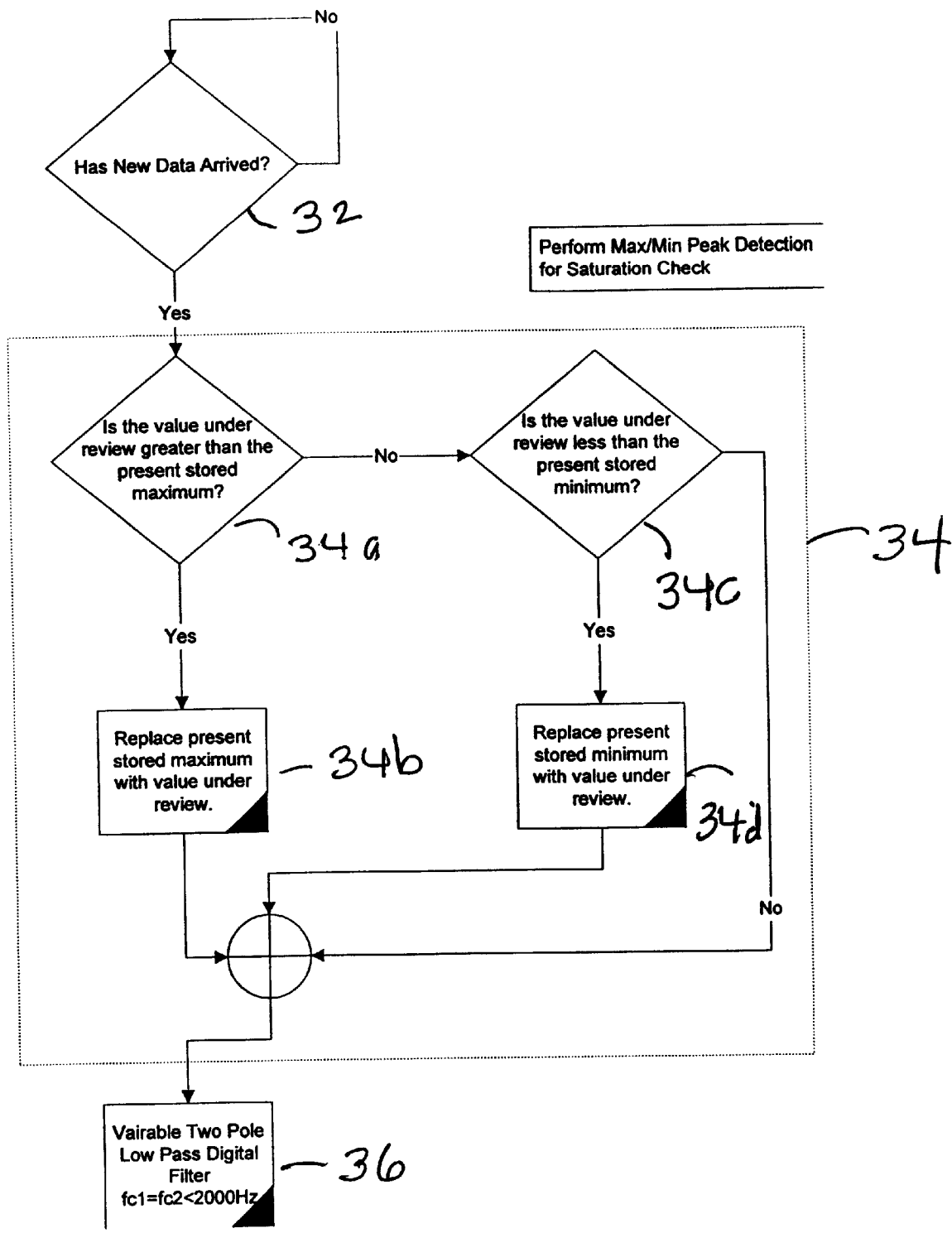
Figure 3 - Detailed Flow Diagram of Max and Min Peak Detection for Saturation Check

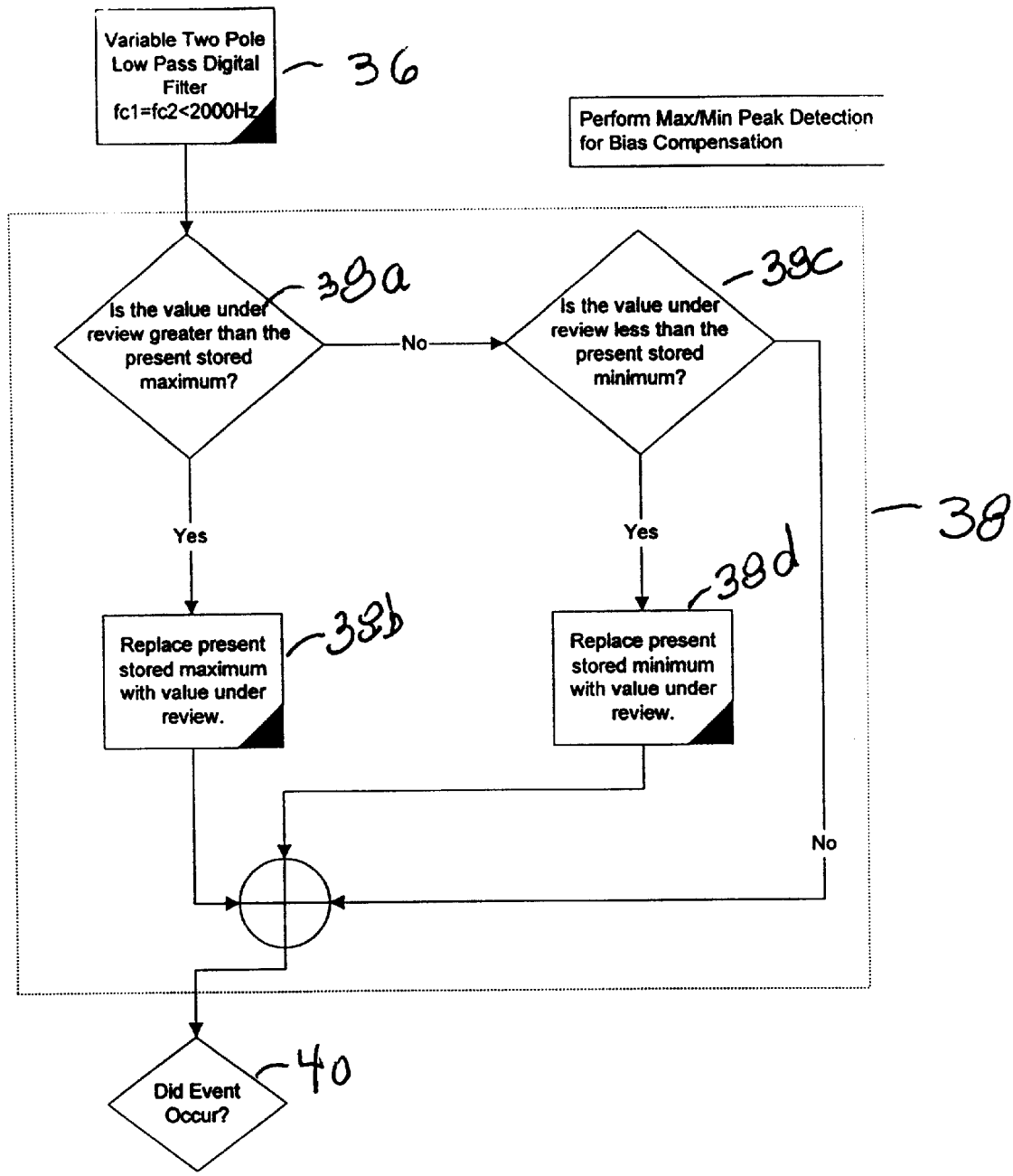
Figure 4 - Detailed Flow Diagram of Max and Min Peak Detection for Bias Compensation

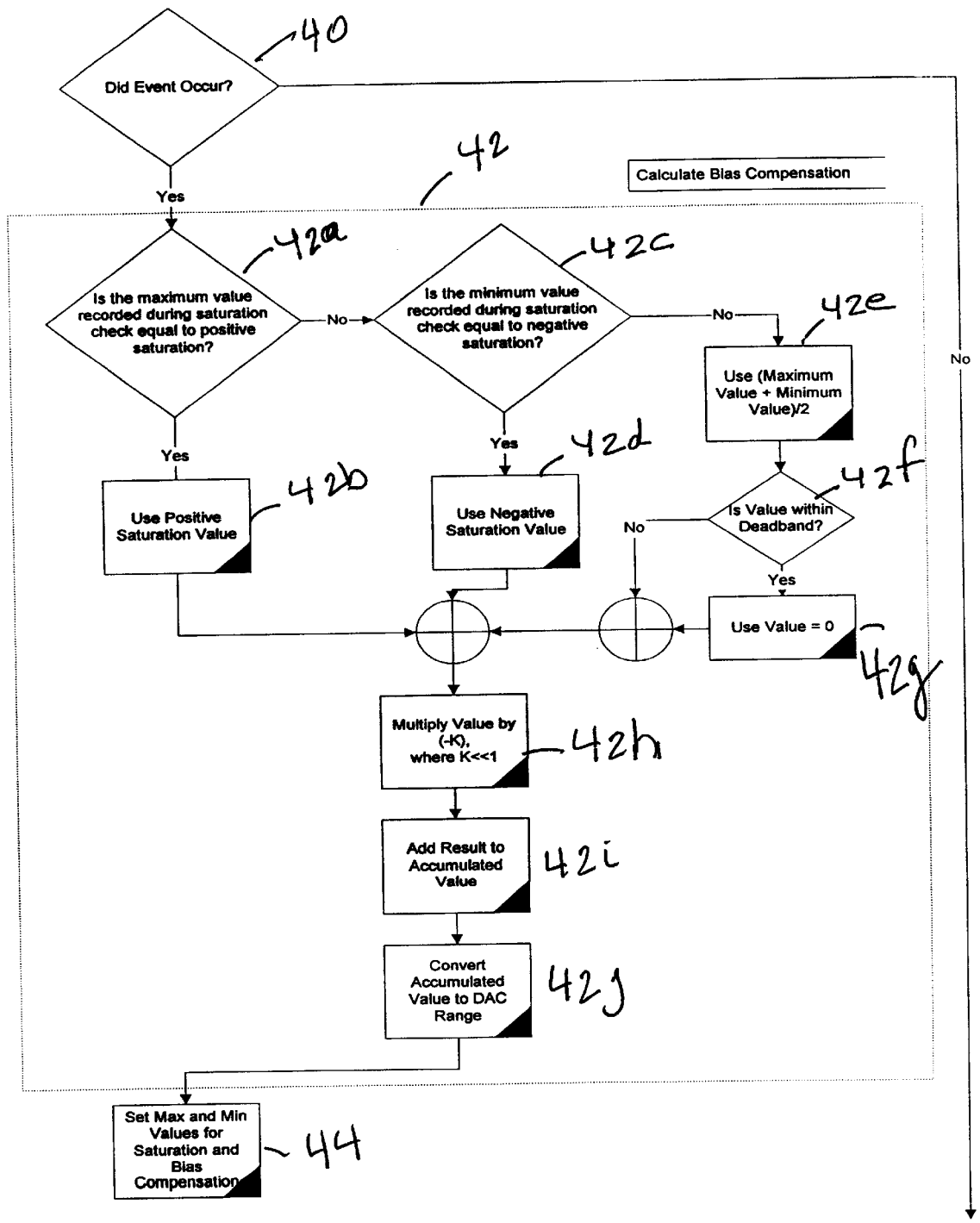
Figure 5 - Detailed Flow Diagram of Bias Calculation

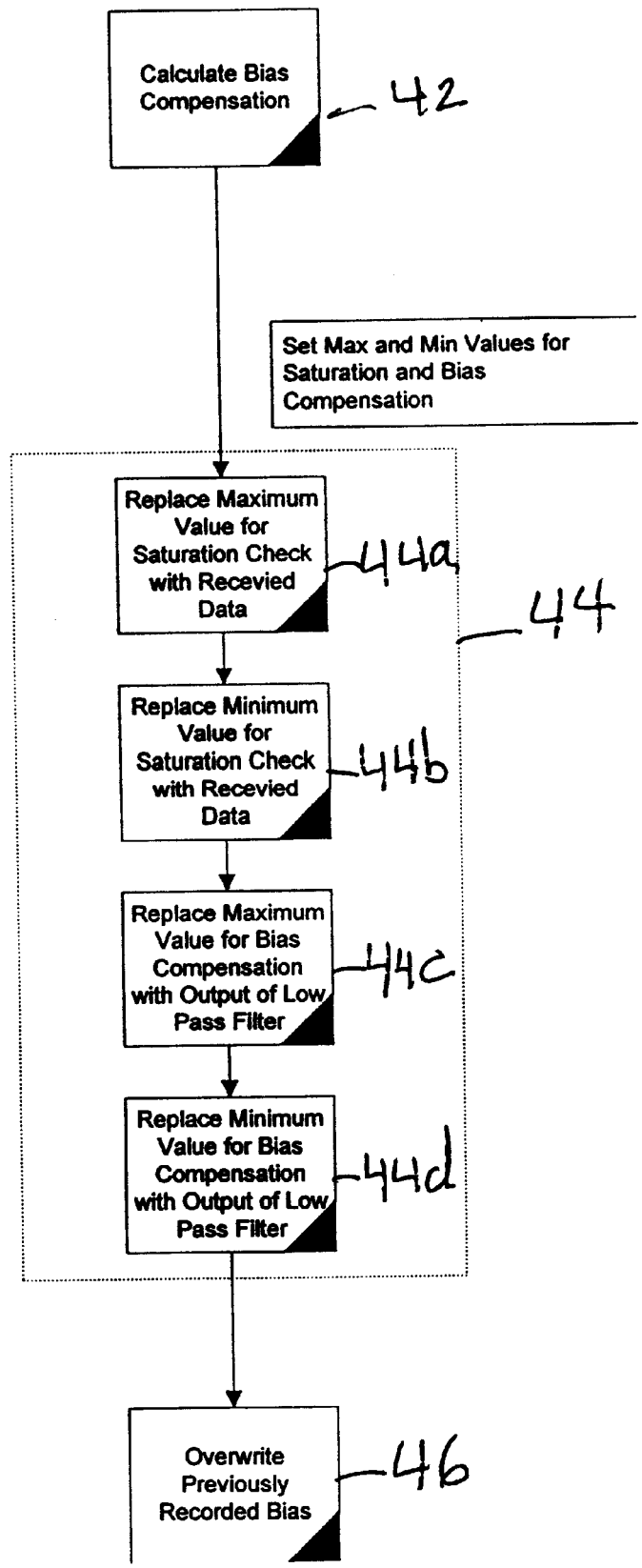
Figure 6 - Detailed Flow Diagram of Max and Min Value Reset

METHOD FOR RECORDING AND REMOVING THE BIPOLAR BIAS FROM A VIBRATION INPUT SIGNAL

FIELD OF THE INVENTION

This invention relates to the time varying signals representing the vibration of a rotating machine and more particularly to the compensation of the bipolar bias in such signals.

DESCRIPTION OF THE PRIOR ART

In the design of protection and diagnostic electronics associated with a rotating machine such as a turbine generator, it is desirable to capture information contained in the time varying waveform of a signal representing the vibration of the machine. A periodic signal in the form of a pulse train is used to set boundaries for evaluation of the samples. When a periodic signal is not present, a timer with a fixed expiration determines the boundaries for evaluation. The information in the time varying waveform is usually offset with a bias voltage that has an amplitude which is many times greater than the amplitude of the relatively high frequency part of the signal representing the machine vibration.

It is important to capture the constant bias or "offset" voltage as that voltage is considered to be the "gap" between the vibration sensing probe and the rotating shaft of the machine. In addition, it is just as important for the protection and diagnostic electronics to analyze the information contained within the relatively low amplitude high frequency portion of the machine vibration signal. Therefore, it is to the advantage of the electronics if as much of the bias can be recorded and removed prior to sampling of the machine vibration signal by the analog-to-digital converter (ADC) in the electronics as this maximizes the ratio of the amplitude of the alternating waveform to the remaining signal.

There are several techniques that have been used in the prior art to remove the offset voltage. One such technique uses a capacitor to only pass the time varying portion of the signal and block the constant part. The disadvantage with this approach is the inability to record the bias value.

Another such technique involves a similar configuration as that of circuit 10 shown in FIG. 1 which as will be described in more detail below is used to practice the method of the present invention, but with digital potentiometers and operational amplifiers in place of the digital-to-analog converter (DAC) 22 used in the present invention. The algorithm associated with the method that uses digital potentiometers and op amps first determines the bias compensation voltage for a fixed number of digital potentiometer settings, then uses the closest value to the bias for compensation. When the lowest setting has been employed, the algorithm records the bias at the input as the amount of compensation applied plus the remaining bias. The advantage of the method of the present invention over this prior art method is that the method of the present invention better maximizes the ratio of high frequency signal to the total signal range applied to the ADC.

SUMMARY OF THE INVENTION

A method for removing the bipolar bias level from a time varying signal and recording the level thereof. The method has the step of firstly determining upon the occurrence of a new event—either a pulse or a timer expiration—if the maximum amplitude of a collection of samples observed between events is equal to a predetermined positive saturation level and multiplying said predetermined positive saturation level by a negative constant which is less than one when said first determination is true to determine a first bias level compensation value.

The method also has the step of secondly determining when the first determination is not true if the minimum amplitude of the collection of samples observed between events is equal to a predetermined negative saturation level and multiplying said predetermined negative saturation level by the negative constant when the second determination is true to determine a second bias level compensation value.

The method has the further steps of thirdly determining if both the first and second determinations are not true the average of the maximum and minimum amplitudes of the collection of samples observed between events and multiplying said average by said negative constant when said average is not within a predetermined range of amplitude values to determine a third bias level compensation value; and adding the first or the second or the third bias level compensation value to a value for the bipolar bias level previously accumulated during the occurrence of the event occurring just prior in time to the new event occurrence.

An apparatus for removing the bipolar bias level from a periodic time varying signal and recording the level thereof. The apparatus has an analog to digital converter having a predetermined sampling rate for converting the time varying signal to digital samples and a digital signal processor. The digital signal processor firstly determines upon the occurrence of a new event if the maximum amplitude of a collection of the digital samples observed between events is equal to a predetermined positive saturation level and multiplies the predetermined positive saturation level by a negative constant, which is less than one, when the first determination is true to determine a first bias level compensation value.

The digital signal processor then secondly determines, when the first determination is not true, if the minimum amplitude of the collection of digital samples observed between events is equal to a predetermined negative saturation level and multiplies the predetermined negative saturation level by the negative constant when the second determination is true to determine a second bias level compensation value.

The digital signal processor then thirdly determines, if both the first and second determinations are not true, the average of the maximum and minimum amplitudes of the collection of digital samples observed between events and multiplies the average by the negative constant when the average is not within a predetermined range of amplitude values to determine a third bias level compensation value.

The digital signal processor then adds the first or the second or the third bias level compensation value to a value for the bipolar bias level previously accumulated during the occurrence of the event occurring just prior in time to the new event occurrence.

An apparatus for removing the bipolar bias level from a periodic time varying signal and recording the level thereof. The apparatus has an analog to digital converter having a predetermined sampling rate for converting the time varying signal to digital samples and a digital signal processor. The digital signal processor determines if a new digital sample has arrived at its input.

The digital signal processor then determines from the amplitude of the new digital sample if either positive or negative saturation has occurred at the digital signal processor input and when positive saturation has occurred replaces the stored maximum amplitude for samples occurring prior to the occurrence of the new digital sample with the new sample amplitude and when negative saturation has occurred replaces the stored minimum amplitude for samples occurring prior to the occurrence of the new digital sample with the new sample amplitude.

The digital signal processor then low pass digitally filters the new digital sample and determines from the amplitude of the digitally filtered new digital sample if the positive or negative amplitude is greater or less than the stored maximum amplitude or stored minimum amplitude for samples occurring prior to the occurrence of the new digital sample and replaces either the stored maximum amplitude when the digitally filtered new digital sample amplitude is greater than the stored maximum amplitude or the stored minimum amplitude when the digitally filtered new digital sample amplitude is less than the stored minimum amplitude.

The digital signal processor then determines if a new event has occurred and upon the occurrence thereof firstly determines if the maximum amplitude stored during the determination from the amplitude of a new digital sample if positive saturation has occurred is equal to a predetermined positive saturation level and multiplies the predetermined positive saturation level by a negative constant which is less than one when the first determination is true to determine a first bias level compensation value.

A method for removing the bipolar bias level from a periodic time varying signal and recording the level thereof. The method determines from the amplitude of a new digital sample of the time varying signal if either positive or negative saturation has occurred at the input of a digital signal processor and when positive saturation has occurred replaces the stored maximum amplitude for samples occurring prior to the occurrence of the new digital sample with the new sample amplitude and when negative saturation has occurred replaces the stored minimum amplitude for samples occurring prior to the occurrence of the new digital sample with the new sample amplitude.

The method then low pass digitally filters the new digital sample and determines from the amplitude of the digitally filtered new digital sample if the positive or negative amplitude is greater or less than the stored maximum amplitude or stored minimum amplitude for samples occurring prior to the occurrence of the new digital sample and replaces either the stored maximum amplitude when the digitally filtered new digital sample amplitude is greater than the stored maximum amplitude or the stored minimum amplitude when the digitally filtered new digital sample amplitude is less than the stored minimum amplitude.

The method then determines if a new event has occurred and upon the occurrence thereof firstly determines if the maximum amplitude stored during the determining from the amplitude of a new digital sample if positive saturation has occurred is equal to a predetermined positive saturation level and multiplies the predetermined positive saturation level by a negative constant which is less than one when the first determination is true to determine a first bias level compensation value.

DESCRIPTION OF THE DRAWINGS

FIG. 1 shows a schematic for a circuit that is used to practice the method of the present invention.

FIG. 2 shows a flow diagram describing the software implemented method performed by the digital signal processor of FIG. 1.

FIG. 3 shows a flow diagram for the step of performing a maximum/minimum peak detection for saturation check in the flow diagram of FIG. 2.

FIG. 4 shows a flow diagram for the step of performing a maximum/minimum peak detection for bias compensation in the flow diagram of FIG. 2.

FIG. 5 shows a flow diagram for the step of calculating the bias compensation in the flow diagram of FIG. 2.

FIG. 6 shows a flow diagram for the step of setting the maximum/minimum values for saturation and bias compensation of FIG. 2.

DESCRIPTION OF THE PREFERRED EMBODIMENT(S)

Referring now to FIG. 1 there is shown the schematic of a circuit 10 which is used to practice the method of the present invention. The input signal, F(t), to differential op amp 12 is f(t)+A where f(t) is the high frequency time varying part of the input that has the information representative of the vibration of the rotating machine and A is the amplitude of the bias voltage. As was described above, A is usually many times greater in amplitude than the amplitude of f(t).

Differential op amp 12 has an attenuation of K which reduces the amplitude of F(t) to within the range of the ADC 14. In order to prevent aliasing of the input, an analog multi-pole anti-alias filter 16 with a corner frequency at least twice the sample rate of the ADC 14 is connected between ADC 14 and summing junction 18. The output of ADC 14 is connected through a digital signal processor (DSP) 20 to a digital-to-analog converter (DAC) 22. The compensation algorithm performed by DSP 20 will be described below in connection with the flow diagram of FIG. 2.

After the compensated value has become, by DAC 22, an analog signal, a gain of G is applied by op amp 24 to thereby place the compensated signal within the range of the input signal F(t) after that signal has been attenuated by op amp 12. The gain enhanced compensated signal, that is, the signal at the output of op amp 24, is then added to the input signal F(t) attenuated by K at the summing junction 18.

A flow diagram describing the software implemented method 30 performed by the digital signal processor (DSP) is shown in FIG. 2. The samples are assumed to arrive at regular intervals and at a rate sufficient to capture enough samples for determination of the input waveform maximum and minimum peaks within the time afforded between events. An event is generated through the expiration of a periodic timer and the time between events is considered the window of evaluation.

Method 30 has a first step 32 of determining if new data has arrived at the input to DSP 20. If not, step 32 is repeated until new data does arrive at the input to DSP 20. When new data has arrived at the input to DSP 20, the method 30 proceeds to step 34 where it checks to determine if the amplitude of the new data is greater than the present maximum value for new data. This check is used to determine if positive saturation has occurred at the input to ADC 14. Step 34 also performs a check to determine if the new data is less than the present minimum value for the new data. This check is used to determine if negative saturation has occurred at the input to ADC 14. Step 34 actually comprises several substeps and a detailed flowchart for these substeps is shown in FIG. 3 which is described below.

Method 30 then proceeds to step 36 where the new data is passed through a low pass digital filter. The filter of step 36 has several functions, only some of which are related to the present invention. The filter serves in the method of the present invention as a smoothing function for the input wave, attenuating high frequency components.

The method then proceeds to step 38 which performs a check to determine if the output of the filter of step 36 is greater than the present maximum value for the filter output. The maximum value is used to determine the residual bias present at the input to the ADC.

Step 38 also performs a check to determine if the output of the filter of step 36 is less than the present minimum value for the filter output. The minimum value is used to determine the residual bias present at the input to the ADC. Step 38 comprises several substeps and a detailed flowchart for these substeps is shown in FIG. 4 which is described below.

In step 40 the method 30 checks for the occurrence of an event. As was described above, an event is based on the expiration of a timer. The timer duration is dependent upon conditions of the system.

If step 40 determines that an event has occurred, the method proceeds to step 42 to calculate the bias compensation which is added to the present value of the total bias. Step 42 comprises a number of substeps and a more detailed flowchart for these substeps is shown in FIG. 5 which is described below. From step 42 the method proceeds to step 44 to set the maximums and minimums associated with the new data and filter output. The maximum and minimum of the new data is assigned the latest sampled data. The maximum and minimum of the filter output is assigned the latest output of the filter.

The method then proceeds to step 46 to overwrite the previously recorded total bias with the latest accumulated value. Thereafter the method proceeds to step 48 to send the latest accumulated value to DAC 22.

The method then proceeds to step 50 wherein it converts the value to millivolts and passes the same to the next system that uses the new bias to determine the gap. The method then returns to step 32 to await the arrival of new data.

If step 40 determines that an event has not occurred, the method skips steps 42, 44, 46 and 48 and goes directly to step 50. The value converted in step 50 in that instance is the previously stored value for the bias recorded for the previously occurring pulse as an event has not occurred. The value converted in step 50 is passed to a system which uses the information contained therein about the level of the bias.

Referring now to FIG. 3 there is shown a detailed flowchart for the several substeps that comprise step 34 in the flowchart of FIG. 2. As was described in connection with FIG. 2, the function of step 34 is to determine whether or not the input to ADC 14 is saturated. The value used in step 42 of FIG. 2 to perform the calculation of the new bias compensation depends on if the input to ADC 14 is positively saturated, negatively saturated, or within the allowable range. This determination is conducted prior to the digital low pass filter of step 36 because of attenuation effects that can occur during the implementation of the filter.

Specifically substep 34a determines if the value under review is greater than the stored present maximum value. If the determination of substep 34a is positive then the present stored maximum value is, in substep 34b, replaced by the value under review. If the determination of substep 34a is negative then step 34 proceeds to substep 34c wherein it is determined if the value under review is less than the present stored minimum value. If the determination of substep 34c is positive then the method proceeds to substep 34d where the present stored minimum value is replaced by the value under review. If the determination of substep 34c is negative, the method proceeds to step 36 as it does from substeps 34b or 34d.

Referring now to FIG. 4 there is shown a detailed flowchart for the several substeps that comprise step 38 in the flowchart of FIG. 2. The attenuation effects that can occur because of the implementation of the function of step 36 are intended for unwanted high frequency components of the input time varying waveform that can cause incorrect calculation of the bias. After this function is performed, another comparison against recorded maximum and minimum values is performed in step 38. The value used within the step 42 which performs the calculation of the new bias compensation depends on the maximum and minimum peak values determined in the substeps that comprise step 38.

Specifically substep 38a determines if the value under review is greater than the present stored maximum value. If that determination is positive then the present stored maximum value is, in substep 38b, replaced with the value under review. If the determination of substep 38a is negative then step 38 proceeds to substep 38c wherein it is determined if the value under review is less than the present stored minimum value. If the determination of substep 38c is positive then the method proceeds to substep 38d where the present stored minimum value is replaced by the value under review. If the determination of substep 38c is negative, the method proceeds to step 40 as it does from substeps 38b or 38d.

Every time a sample is received, the steps described above in connection with FIGS. 3 and 4 are executed. The maximum and minimum peak checks as well as the attenuation of unwanted high frequency signals occur within the window of evaluation.

Every time an event occurs, the window of evaluation ends, and the code described below is executed. First, the bias compensation of step 42 of FIG. 2 is calculated. A detailed flow diagram for the substeps that comprise the bias calculation of step 42 is shown in FIG. 5. The function of step 42 can be summarized as follows:

$$Y(kT) = N(-KX(kT) + Y(kT-T))$$

where $K \ll 1$, N represents a constant for converting to the range of the DAC 22, $Y(kT-T)$ represents the previous bias compensation value, $X(kT)$ represents the basis of the incremental. It is assumed that the initial condition of $Y(kT-T)$ is zero. In one embodiment for circuit 10, K was selected to be 0.075.

The decision making during the execution of step 42 concerns the value of $X(kT)$. If the maximum sampled value recorded during the evaluation window is positive saturation, then $X(kT)$ equals the maximum positive value. If the minimum sampled value recorded during the evaluation window is negative saturation, then $X(kT)$ equals the maximum negative value. If neither case is true, then $X(kT)$ equals the average of the maximum and minimum values recorded during the peak check of the filter output, but only if that value is greater than a predetermined dead band.

A dead band is utilized for reducing the frequency of adjustment to the bias compensation. While the dead band makes the recorded value of the bias less accurate, it decreases the variability of the signal due to minute changes in amplitude. If the average value is less than the dead band, then $X(kT)=0$. In one embodiment for circuit 10, the dead band was the equivalent of 100 mV.

The substeps of step 42 are shown in the flowchart of FIG. 5. Substep 42a determines if the maximum value recorded during the saturation check is equal to the positive saturation. If the determination is positive then in substep 42b the positive saturation value is used for X(kT). If the determination is negative substep 42a proceeds to substep 42c where it is determined if the minimum value recorded during the saturation check is equal to negative saturation. If the determination in substep 42c is positive then in substep 42d the negative saturation value is used for X(kT). If the determination in substep 42c is negative then step 42 proceeds to substep 42e wherein the average of the maximum and minimum values is calculated.

The method of step 42 proceeds to substep 42f wherein it is determined if the average value calculated in substep 42e is within a predetermined dead band. If that determination is positive the method proceeds to substep 42g where the value of X(kT) is set equal to zero. If the determination by substep 42f is negative then the average value calculated in substep 42e is used for X(kT).

The method of step 42 then proceeds to substep 42h where either the positive saturation value of substep 42b or the negative saturation value of substep 42d or the average value of substep 42e or the value of zero from substep 42g is multiplied by −K where K<<1. The method proceeds to substep 42i where the result of substep 42h is added to the accumulated value. Step 42 then proceeds to substep 42j where the accumulated value is converted to the range of DAC 22.

One of the last steps in the method 30 involves the step 44 of resetting the maximum and minimum peak values. A detailed flow diagram of the substeps comprising step 44 is shown in FIG. 6. The values need to be reset so as to capture a reduction in either peak over time. This also means that the window of evaluation must be large enough to capture at least one maximum peak and one minimum peak. Obviously then, based on the length of the timer, there will be a lower limit to the frequency of the time varying signal that can be applied to the method of the present invention.

After the maximum and minimum peak values have been reset, the previously recorded bias is overwritten with the newly calculated value, the value is transmitted to the DAC 22, other operations may be performed on the value, and then the DSP 20 waits for new data to repeat the process.

The first substep 44a of step 44 replaces the maximum value for the saturation check with the received data. The next substep 44b replaces the minimum value for the saturation check with the received data. Step 44 then proceeds to substep 44c where the maximum value for the bias compensation is replaced with the output of the low pass filter of step 36. The final substep in step 44 is substep 44d where the minimum value for the bias compensation is replaced with the output of the low pass filter of step 36.

It should be appreciated that the steps 42, 44, 46, 48 and 50 are performed upon the occurrence of the next event. It should further be appreciated that the computation time associated with steps 42, 44, 46, 48 and 50 is very short as compared to the time between the occurrence of the events. It should also be appreciated that the present invention approaches the dead band asymptotically to avoid an overshoot and possible oscillation in the calculation of the bipolar bias level. It should also further be appreciated that the value for K is selected such that the dead band is approached quickly and in a stable manner.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method for removing the bipolar bias level from a periodic time varying signal and recording the level thereof comprising:
   a) firstly determining upon the occurrence of a new event if the maximum amplitude of a collection of samples observed between events is equal to a predetermined positive saturation level and multiplying said predetermined positive saturation level by a negative constant, which is less than one, when said first determination is true to determine a first bias level compensation value;
   b) secondly determining, when said first determination is not true, if the minimum amplitude of said collection of samples observed between events is equal to a predetermined negative saturation level and multiplying said predetermined negative saturation level by said negative constant when said second determination is true to determine a second bias level compensation value;
   c) thirdly determining, if both said first and second determinations are not true, the average of said maximum and minimum amplitudes of said collection of samples observed between events and multiplying said average by said negative constant when said average is not within a predetermined range of amplitude values to determine a third bias level compensation value; and
   d) adding said first or said second or said third bias level compensation value to a value for said bipolar bias level previously accumulated during the occurrence of said event occurring just prior in time to said new event occurrence.

2. The method of claim 1 further comprising adding a bias level compensation value of zero to said value for said previously accumulated bipolar bias level when said average is within said predetermined range of amplitude values.

3. An apparatus for removing the bipolar bias level from a periodic time varying signal and recording the level thereof comprising:
   an analog to digital converter having a predetermined sampling rate for converting said time varying signal to digital samples;
   a digital signal processor for:
      a) firstly determining upon the occurrence of a new event if the maximum amplitude of a collection of said digital samples observed between events is equal to a predetermined positive saturation level and multiplying said predetermined positive saturation level by a negative constant, which is less than one, when said first determination is true to determine a first bias level compensation value;
      b) secondly determining, when said first determination is not true, if the minimum amplitude of said collection of digital samples observed between events is equal to a predetermined negative saturation level and multiplying said predetermined negative saturation level by said negative constant when said second determination is true to determine a second bias level compensation value;
      c) thirdly determining, if both said first and second determinations are not true, the average of said maximum and minimum amplitudes of said collection of digital samples observed between events and multiplying said average by said negative constant when said average is not within a predetermined range of amplitude values to determine a third bias level compensation value; and d) adding said first or said second or said third bias level compensation value to a value for said bipolar bias level previously accumulated during the occurrence of said event occurring just prior in time to said new event occurrence.

4. The apparatus of claim 3 wherein said digital signal processor further adds a bias level compensation value of zero to said value for said previously accumulated bipolar bias level when said average is within said predetermined range of amplitude values.

5. An apparatus for removing the bipolar bias level from a periodic time varying signal and recording the level thereof comprising:
   an analog to digital converter having a predetermined sampling rate for converting said time varying signal to digital samples;
   a digital signal processor for:
      (i) determining if a new digital sample has arrived at the input of said digital signal processor;
      (ii) determining from the amplitude of said new digital sample if either positive or negative saturation has occurred at said digital signal processor input and, when positive saturation has occurred, replacing the stored maximum amplitude for samples occurring prior to the occurrence of said new digital sample with said new sample amplitude and, when negative saturation has occurred, replacing the stored minimum amplitude for samples occurring prior to the occurrence of said new digital sample with said new sample amplitude;
      (iii) low pass digitally filtering said new digital sample;
      (iv) determining from the amplitude of said digitally filtered new digital sample if the positive or negative amplitude is greater or less than the stored maximum amplitude or stored minimum amplitude for samples occurring prior to the occurrence of said new digital sample and replacing either said stored maximum amplitude, when said digitally filtered new digital sample amplitude is greater than said stored maximum amplitude, or said stored minimum amplitude, when said digitally filtered new digital sample amplitude is less than said stored minimum amplitude; and
      (v) determining if a new event has occurred and upon the occurrence thereof firstly determining if the maximum amplitude stored during the determining from the amplitude of a new digital sample if positive saturation has occurred is equal to a predetermined positive saturation level and multiplying said predetermined positive saturation level by a negative constant, which is less than one, when said first determination is true to determine a first bias level compensation value.

6. The apparatus of claim 5 wherein said digital signal processor secondly determines, when said first determination is not true, if the minimum amplitude stored during the determining from the amplitude of a new digital sample if negative saturation has occurred is equal to a predetermined negative saturation level and multiplying said predetermined negative saturation level by said negative constant when said second determination is true to determine a second bias level compensation value.

7. The apparatus of claim 6 wherein said digital signal processor thirdly determines, if both said first and second determinations are not true, the average of said maximum and minimum amplitudes stored during the determining if positive or negative saturation has occurred and multiplying said average by said negative constant when said average is not within said a predetermined range of amplitude values to determine a third bias level compensation value.

8. The apparatus of claim 7 wherein said digital signal processor adds said first or said second or said third bias level compensation value to a value for said bipolar bias level previously accumulated during the occurrence of said event occurring just prior in time to said new event occurrence.

9. A method for removing the bipolar bias level from a periodic time varying signal and recording the level thereof comprising:
   (a) determining from the amplitude of a new digital sample of said time varying signal if either positive or negative saturation has occurred at the input of a digital signal processor and, when positive saturation has occurred, replacing the stored maximum amplitude for samples occurring prior to the occurrence of said new digital sample with said new sample amplitude and, when negative saturation has occurred, replacing the stored minimum amplitude for samples occurring prior to the occurrence of said new digital sample with said new sample amplitude;
   (b) low pass digitally filtering said new digital sample;
   (c) determining from the amplitude of said digitally filtered new digital sample if the positive or negative amplitude is greater or less than the stored maximum amplitude or stored minimum amplitude for samples occurring prior to the occurrence of said new digital sample and replacing either said stored maximum amplitudes, when said digitally filtered new digital sample amplitude is greater than said stored maximum amplitude or said stored minimum amplitude, when said digitally filtered new digital sample amplitude is less than said stored minimum amplitude; and
   (d) determining if a new event has occurred and upon the occurrence thereof firstly determining if the maximum amplitude stored during the determining from the amplitude of a new digital sample if positive saturation has occurred is equal to a predetermined positive saturation level and multiplying said predetermined positive saturation level by a negative constant, which is less than one, when said first determination is true to determine a first bias level compensation value.

10. The method of claim 9 further comprising secondly determining, when said first determination is not true, if the minimum amplitude stored during the determining from the amplitude of a new digital sample if negative saturation has occurred is equal to a predetermined negative saturation level and multiplying said predetermined negative saturation level by said negative constant when said second determination is true to determine a second bias level compensation value.

11. The method of claim 10 further comprising thirdly determining, if both said first and second determinations are not true, the average of said maximum and minimum amplitudes stored during the determining if positive or negative saturation has occurred and multiplying said average by said negative constant when said average is not within said a predetermined range of amplitude values to determine a third bias level compensation value.

12. The method of claim 11 further comprising adding said first or said second or said third bias level compensation value to a value for said bipolar bias level previously accumulated during the occurrence of said event occurring just prior in time to said new event occurrence.

* * * * *